(12) United States Patent
Park et al.

(10) Patent No.: US 12,188,120 B2
(45) Date of Patent: Jan. 7, 2025

(54) METHOD OF FORMING COMPOUND STRUCTURE WITH 2-DIMENSIONAL STRUCTURE

(71) Applicants: SEOUL NATIONAL UNIVERSITY R&DB FOUNDATION, Seoul (KR); INSTITUTE FOR BASIC SCIENCE, Daejeon (KR)

(72) Inventors: Jungwon Park, Seoul (KR); Jihoon Kim, Seoul (KR)

(73) Assignees: SEOUL NATIONAL UNIVERSITY R&DB FOUNDATION, Seoul (KR); INSTITUTE FOR BASIC SCIENCE, Daejeon (KR)

( * ) Notice: Subject to any disclaimer, the term of this patent is extended or adjusted under 35 U.S.C. 154(b) by 0 days.

(21) Appl. No.: 18/047,970

(22) Filed: Oct. 19, 2022

(65) Prior Publication Data

US 2023/0175122 A1    Jun. 8, 2023

(30) Foreign Application Priority Data

Oct. 26, 2021   (KR) ........................ 10-2021-0143315

(51) Int. Cl.
| | | |
|---|---|---|
| C23C 16/30 | (2006.01) | |
| C23C 16/02 | (2006.01) | |
| C23C 16/458 | (2006.01) | |
| C23C 16/46 | (2006.01) | |

(52) U.S. Cl.
CPC ........ *C23C 16/305* (2013.01); *C23C 16/0272* (2013.01); *C23C 16/4582* (2013.01); *C23C 16/46* (2013.01)

(58) Field of Classification Search
CPC .............. C23C 16/305; C23C 16/0272; C23C 16/4582; C23C 16/46
See application file for complete search history.

(56) References Cited

U.S. PATENT DOCUMENTS

| | | | | |
|---|---|---|---|---|
| 2007/0227351 A1* | 10/2007 | Garcia-Martinez | ...... | B01J 29/40 210/660 |
| 2014/0093645 A1* | 4/2014 | Thimsen | ................. | C23C 16/56 427/255.4 |
| 2016/0240376 A1* | 8/2016 | Yeh | ........................ | C23C 16/482 |
| 2017/0073809 A1* | 3/2017 | Choi | .................... | C23C 14/0021 |
| 2017/0175258 A1* | 6/2017 | Robinson | .............. | C23C 16/305 |
| 2018/0016132 A1* | 1/2018 | Koenig | ................. | B81C 1/00476 |
| 2018/0099916 A1* | 4/2018 | Hatanpää | ................. | C07C 49/92 |
| 2018/0105930 A1* | 4/2018 | Kang | ................. | C23C 16/45527 |
| 2019/0338416 A1* | 11/2019 | Kong | ................. | C23C 16/45512 |
| 2020/0181768 A1 | 6/2020 | Choi et al. | | |
| 2022/0228255 A1* | 7/2022 | Palm | .................... | C23C 14/5866 |

FOREIGN PATENT DOCUMENTS

| | | | |
|---|---|---|---|
| KR | 10-2017-0048873 A | 5/2017 | |
| KR | 10-2018-0058647 A | 6/2018 | |
| KR | 10-2019-0074627 A | 6/2019 | |
| KR | 10-2102691 B1 | 4/2020 | |
| WO | WO 2019/144335 | * 1/2019 | ............. H01L 51/42 |

OTHER PUBLICATIONS

Xie, Chunyu, et al., "Roles of salts in the chemical vapor deposition synthesis of two-dimensional transition metal chalcogenides". Dalton Trans., 2020, 49, 10319-10327.*
You, Jiawen, et al., "Synthesis of 2D transition metal dichalcogenides by chemical vapor deposition with controlled layer number and morphology". Nano Convergence (2018) 5:26, pp. 1-13.*
Huang, Yu Li, et al., "Two-dimensional magnetic transition metal chalcogenides". SmartMat, 2021, 2:139-153.*
Millard, Toby Severs, et al., "Large area chemical vapour deposition grown transition metal dichalcogenide monolayers automatically characterized through photoluminescence imaging". Nature Partner Journals, 2D Materials and Applications (2020) 12, pp. 1-9.*
Chaki, Sunil H., et al., "Synthesis of manganese sulfide (MnS) thin films by chemical bath deposition and their characterization". Journal of Materials Research and Technology, vol. 6, Issue 2, Apr.-Jun. 2017, pp. 123-128.*
Afzaal, Mohammad, et al., "Growth of lead chalcogenide thin films using single-source precursors". J. Mater. Chem., 2004, 14, 1310-1315.*
Fardy, Melissa, et al., "Synthesis and Thermoelectrical Characterization of Lead Chalcogenide Nanowires". Advanced Materials, 2007, 19, 3047-3051.*

* cited by examiner

*Primary Examiner* — Bret P Chen

(57) ABSTRACT

A method of forming a compound structure according to embodiments of the present disclosure comprises loading a metal precursor on a substrate, providing a chalcogen precursor to the substrate, and reacting the chalcogen precursor with the metal precursor. The metal precursor comprises transition metal nanoparticles. The compound structure has a 2-dimensional structure.

9 Claims, 23 Drawing Sheets

METHOD OF FORMING COMPOUND STRUCTURE WITH 2-DIMENSIONAL STRUCTURE

CROSS-REFERENCE TO RELATED APPLICATIONS

This application claims priority to and the benefit of Korean Patent Application No. 10-2021-0143315 filed on Oct. 26, 2021 in the Korean Intellectual Property Office, the disclosures of which are incorporated by reference herein in their entireties.

BACKGROUND OF THE INVENTION

1. Field of the Invention

The present invention relates to a compound structure and a forming method thereof.

2. Description of the Related Art

Transition metal chalcogen compounds are being studied as materials that can be utilized in various fields such as electrons and catalysts. In particular, various methods for producing 2D transition metal chalcogen compounds have been studied, but the process is not only very complex, but it is also very difficult to form a single atomic layer.

SUMMARY OF THE INVENTION

The present invention provides a method of forming a compound structure of a 2-dimensional structure.

The present invention provides a compound structure of a 2-dimensional structure formed by the method.

The other objects of the present invention will be clearly understood with reference to the following detailed description and the accompanying drawings.

The method of forming a compound structure according to embodiments of the present invention comprises loading a metal precursor on a substrate, providing a chalcogen precursor to the substrate, and reacting the chalcogen precursor with the metal precursor.

The metal precursor may comprise transition metal nanoparticles and the chalcogen precursor may comprise at least one of sulfur, selenium, and tellurium. The transition metal nanoparticles may comprise at least one of $MoO_2$ nanoparticles and $W_{18}O_{49}$ nanoparticles.

The loading the metal precursor on the substrate may comprise forming a precursor solution comprising the transition metal nanoparticles and spin-coating the precursor solution on the substrate. The forming the precursor solution may comprise adding a catalyst material to the precursor solution and the catalyst material may comprise at least one of sodium chloride and potassium hydroxide.

The compound structure may be formed by performing a CVD process.

The providing the chalcogen precursor to the substrate may comprise disposing the substrate and the chalcogen precursor in a furnace and providing carrier gas to the furnace, and the chalcogen precursor may be supplied to the substrate by the carrier gas.

The furnace may comprise a first furnace and a second furnace that are heated independently of each other. The chalcogen precursor may be disposed in the first furnace, the substrate may be disposed in the second furnace, and the carrier gas may flow from the first furnace to the second furnace. The heating temperature of the second furnace may be higher than the heating temperature of the first furnace. The substrate is tilted with respect to the flow direction of the carrier gas.

The compound structure according to embodiments of the present invention is formed by the method and has a 2-dimensional structure.

The compound structure may have an atomic level thickness. The compound structure may have a monolayer structure. The compound structure may comprise a transition metal chalcogen compound.

According to embodiments of the present invention, a compound structure of 2-dimensional structure can be easily formed. The compound structure may have an atomic level thickness. Using nanoparticle precursors and a CVD process, mass production of the compound structure with 2-dimensional structure is possible. The growth parameters of the CVD process can be adjusted to produce a variety of 2-dimensional materials.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF SPECIFIC EMBODIMENTS

Figure 1:
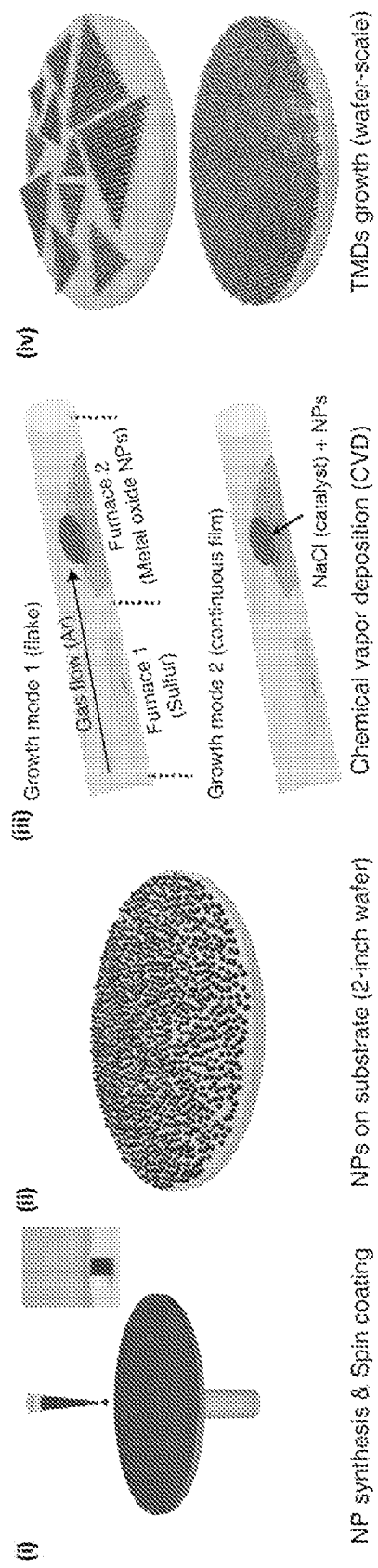
FIG. 1 is a view for explaining a method of forming a compound structure according to an embodiment of the present invention.

Hereinafter, a detailed description will be given of the present invention with reference to the following embodiments. The purposes, features, and advantages of the present invention will be easily understood through the following embodiments. The present invention is not limited to such embodiments, but may be modified in other forms. The embodiments to be described below are nothing but the ones provided to bring the disclosure of the present invention to perfection and assist those skilled in the art to completely understand the present invention. Therefore, the following embodiments are not to be construed as limiting the present invention.

Terms like 'first', 'second', etc., may be used to indicate various components, but the components should not be restricted by the terms. These terms are only used to distinguish one element, component, region, layer or section from another region, layer or section. A first element, component, region, layer or section could be termed a second element, component, region, layer or section without departing from the teaching of the embodiments of the present invention. It will be understood that when an element is referred to as being "on" another element, it can be directly on the other element or intervening elements may be present therebetween.

The terminology used herein is for the purpose of describing particular embodiments only and is not intended to limit the invention. It is to be understood that the singular forms "a," "an," and "the" include plural references unless the context clearly dictates otherwise. It will be further understood that the terms "comprises" or "has," when used in this specification, specify the presence of stated features, integers, steps, operations, elements, and/or components, but do not preclude the presence or addition of one or more other features, integers, steps, operations, elements, components, and/or groups thereof.

In the following embodiments, transition metal chalcogen compound is described as an example of a compound structure, but is not limited thereto, and various compounds may be applied.

The method of forming a compound structure according to embodiments of the present invention comprises loading a metal precursor on a substrate, providing a chalcogen precursor to the substrate, and reacting the chalcogen precursor with the metal precursor.

The substrate may comprise, for example, a silicon substrate, a sapphire substrate, a soda lime glass substrate, and the like.

The metal precursor may comprise transition metal nanoparticles and the chalcogen precursor may comprise at least one of sulfur, selenium, and tellurium. The transition metal nanoparticles may comprise at least one of $MoO_2$ nanoparticles and $W_{18}O_{49}$ nanoparticles.

The loading the metal precursor on the substrate may comprise forming a precursor solution comprising the transition metal nanoparticles and spin-coating the precursor solution on the substrate.

The forming the precursor solution may comprise adding a catalyst material to the precursor solution and the catalyst material may comprise at least one of sodium chloride and potassium hydroxide.

The compound structure may be formed by performing a CVD process. The CVD process may be, for example, an APCVD process.

The providing the chalcogen precursor to the substrate may comprise disposing the substrate and the chalcogen precursor in a furnace and providing carrier gas to the furnace, and the chalcogen precursor may be supplied to the substrate by the carrier gas.

The furnace may comprise a first furnace and a second furnace that are heated independently of each other. The chalcogen precursor may be disposed in the first furnace, the substrate may be disposed in the second furnace, and the carrier gas may flow from the first furnace to the second furnace. The heating temperature of the second furnace may be higher than the heating temperature of the first furnace. The substrate is tilted with respect to the flow direction of the carrier gas.

The compound structure according to embodiments of the present invention is formed by the method and has a 2-dimensional structure.

The compound structure may have an atomic level thickness. The compound structure may have a monolayer structure. The compound structure may comprise a transition metal chalcogen compound.

[Synthesis Example of $MoO_2$ Nanoparticle Precursors]

$MoO_2$ nanoparticles can be synthesized using hydrothermal synthesis. Ammonium molybdate tetrahydrate (150 mg) is added to 22 mL of deionized water being stirred in a Teflon cup (50 mL). After adding 10 mL of ethanol to the solution, 500 mg of polyvinylpyrrolidone (PVP, molecular weight: 40,000) is added and stirred vigorously for 30 minutes. The reaction mixture and the Teflon cup are transferred to the stainless steel autoclave and sealed completely. The Teflon-lined autoclave is heat-treated in a heating oven at 180° C. for 16 hours. After heat treatment and natural cooling, the black precipitate is accelerated centrifuged to 12,000 rpm for 30 minutes and then washed three times with acetone and ethanol solvents. The precipitate is dried at 70° C. for 12 hours. The synthesized $MoO_2$ nanoparticles are stored in ethanol and this solution is used as a $MoO_2$ nanoparticles precursor solution.

[Synthesis Example of $W_{18}O_{49}$ Nanoparticle Precursors]

$W_{18}O_{49}$ nanoparticles can be synthesized using hydrothermal synthesis. Tungsten hexachloride ($WCl_6$) (120 mg) is added to 40 mL of anhydrous ethanol in a glove box (Ar atmosphere). Then, 500 mg of polyvinylpyrrolidone (PVP, molecular weight: 40,000) is added to the mixture. After stirring vigorously for 30 minutes, the mixture is transferred to a Teflon cup and stainless steel autoclave. The Teflon-lined autoclave is heated at 200° C. for 48 hours and naturally cooled after the reaction. The precipitate is washed several times with acetone and ethanol cosolvents and dried at 70° C. for 12 hours. The synthesized $W_{18}O_{49}$ nanoparticles are stored in ethanol and this solution is used as a $W_{18}O_{49}$ nanoparticle precursor solution.

[Formation Example of $MoS_2$ Monolayer Flakes]

The substrate is washed with acetone and ethanol with sonication for 10 minutes and rinsed with isopropyl alcohol. The substrate is placed in a muffle furnace and heated at 1,000° C. for 2 hours. After a 4-hour annealing process, the substrate is naturally cooled and blown by nitrogen gas. A $MoO_2$ nanoparticle precursor solution (0.8 mL) is loaded onto the substrate using a spin coating. The rotational speed and spin coating time are set at 3,000 rpm and 60 seconds. The substrate on which the nanoparticles are loaded and the sulfur powder are loaded into the two chambers of the CVD system as shown in FIG. 1. The sulfur powder is disposed in the first furnace (furnace 1) and the substrate loaded with the nanoparticle precursors is disposed in the second furnace (furnace 2). The first furnace and the second furnace are heated independently at 150° C. and 850° C., respectively, under 100 sccm (standard cubic centimeter per minute) of argon flow (Ar, carrier gas), respectively. When the process is completed, the furnaces are opened and naturally cooled to room temperature.

[Formation Example of $MoS_2$ Continuous Film]

A methanol solution including NaCl (0.1M) is added to the nanoparticle precursor solution (volume ratio 1:50). This $NaCl-MoO_2$ precursor solution is loaded onto a substrate and spin-coated to uniformly distribute the $NaCl-MoO_2$ precursor. The substrate on which the precursor is loaded is loaded into a CVD chamber with 20 mg sulfur powder. The first furnace and the second furnace are heated at 150° C. and 650° C., respectively, under 600 sccm of Ar flow. After 20 minutes of growth, the furnaces are opened and naturally cooled to room temperature.

[Formation Example of $Mo_{1-x}W_xS_2$ Alloy Monolayer]

$MoO_2$ and $W_{18}O_{49}$ nanoparticle precursor solutions are mixed in various proportions. The mixed solution (1 mL) is loaded onto a substrate and spin-coated to distribute the precursors uniformly. The first furnace and the second furnace are heated at 160° C. and 800° C., respectively, under 500 sccm of Ar flow. After 5 minutes, the second furnace is heated at 900° C. and maintained for 5 minutes. When the process is completed, the furnaces are opened and cooled to room temperature.

[Formation Example of $MoS_2$ Monolayer Flakes on Soda Lime Glass]

The soda lime glass substrate is washed with acetone and ethanol with sonication for 10 minutes and rinsed with isopropyl alcohol. A $MoO_2$ nanoparticle precursor solution (0.8 mL) is loaded onto the substrate using a spin coating. The first furnace and the second furnace are heated to 150° C. and 600° C., respectively, under 500 sccm of Ar flow. When the process is completed, the furnaces are opened and naturally cooled to room temperature.

[Transfer Example of $MoS_2$ Continuous Film]

2 mL of a polystyrene (PS) solution (9 g of PS beads dissolved in 100 mL toluene) is loaded and the $MoS_2$ film grown on a sapphire substrate by spin n coating is uniformly deposited. The substrate is baked at 90° C. for 5 minutes. A thermal release tape (TRT) is attached to the PS and $MoS_2$ film after baking and the TRT assembly is immersed in deionized water. The TRT assembly is gently peeled off (water molecules penetrate into the gap between $MoS_2$ and sapphire due to surface tension differences) and residual deionized water is blown into nitrogen gas. The dried TRT assembly is attached to the surface of the desired substrate and heated to 120° C. (10 seconds) for TRT removal. Finally, the transferred PS and $MoS_2$ film is soaked in toluene to dissolve the PS (1 hour), washed with acetone, and blown by the nitrogen gas.

[Manufacturing Example of a Flexible Device]

For the manufacture of ultra-thin flexible logic circuits and phototransistors, a polyimide (PI) film (420 nm thickness) is spin-coated on a $SiO_2$/Si substrate, and a $Si_3N_4$ layer (25 nm thickness) is deposited on the polyimide film using PECVD. The $MoS_2$ film is transferred onto the SigNA layer and patterned with photolithography and dry etching. The Ti/Au layer (5 nm/25 nm thickness) is deposited using a thermal evaporation process and patterned by a lift-off method to form a source/drain electrodes. Using the atomic layer deposition process, the $Al_2O_3$ gate dielectric (25 mm thickness) is deposited at 200° C. and patterned by photolithography and wet etching. The Ti/Au layer (5 nm/25 nm thickness) is deposited using a thermal evaporation process and patterned by a lift-off method to form a gate electrode. For upper encapsulation, a parylene film (500 nm thickness) is deposited. The parylene film is patterned and etched for electrical contact. The flexible device is peeled off the $SiO_2$/Si substrate through a smooth mechanical peeling and transferred to a desired substrate such as a polydimethylsiloxane (PDMS) substrate or human skin.

FIG. 1 is a view for explaining a method of forming a compound structure according to an embodiment of the present invention.

Referring to FIG. 1, transition metal oxide nanoparticles are formed. Transition metal oxide nanoparticles such as $MoO_2$ and $W_{18}O_{49}$ can be synthesized according to a typical colloidal process. The transition metal oxide nanoparticles are stored in the solvent and used as a precursor solution for forming transition metal dichalcogenide monolayer. The precursor solution is deposited on a substrate by spin coating. The concentration of the precursor solution and the rotational speed of the spin coating may be controlled taking into account the desired coverage of the nanoparticle precursors on the substrate. By the spin coating process, the nanoparticle precursors can be uniformly distributed on the substrate. The substrate on which the nanoparticle precursors are loaded and the sulfur powder are disposed in the furnace. The furnace may include a first furnace (Furnace 1) and a second furnace (Furnace 2) that are heated independently of each other. The sulfur powder is disposed in the first furnace and the substrate on which the nanoparticle precursors are loaded is disposed in the second furnace. A carrier gas (e.g., Ar) is provided from the first furnace to the second furnace. The furnace or the substrate may be tilted with respect to the flow direction of the carrier gas, and by the carrier gas the sulfur precursor may be uniformly supplied to the substrate. A CVD process can be performed on the substrate to form a transition metal dichalcogenide monolayer. The CVD process may be an APCVD process. When the catalyst is not included, transition metal dichalcogenide monolayer flakes can be formed by growing in a first growth mode (Growth mode 1) by the CVD process. When the precursor solution comprises a catalyst such as NaCl, a transition metal dichalcogenide continuous film can be formed by growing in a second growth mode (Growth mode 2) by the CVD process.

Figure 2:
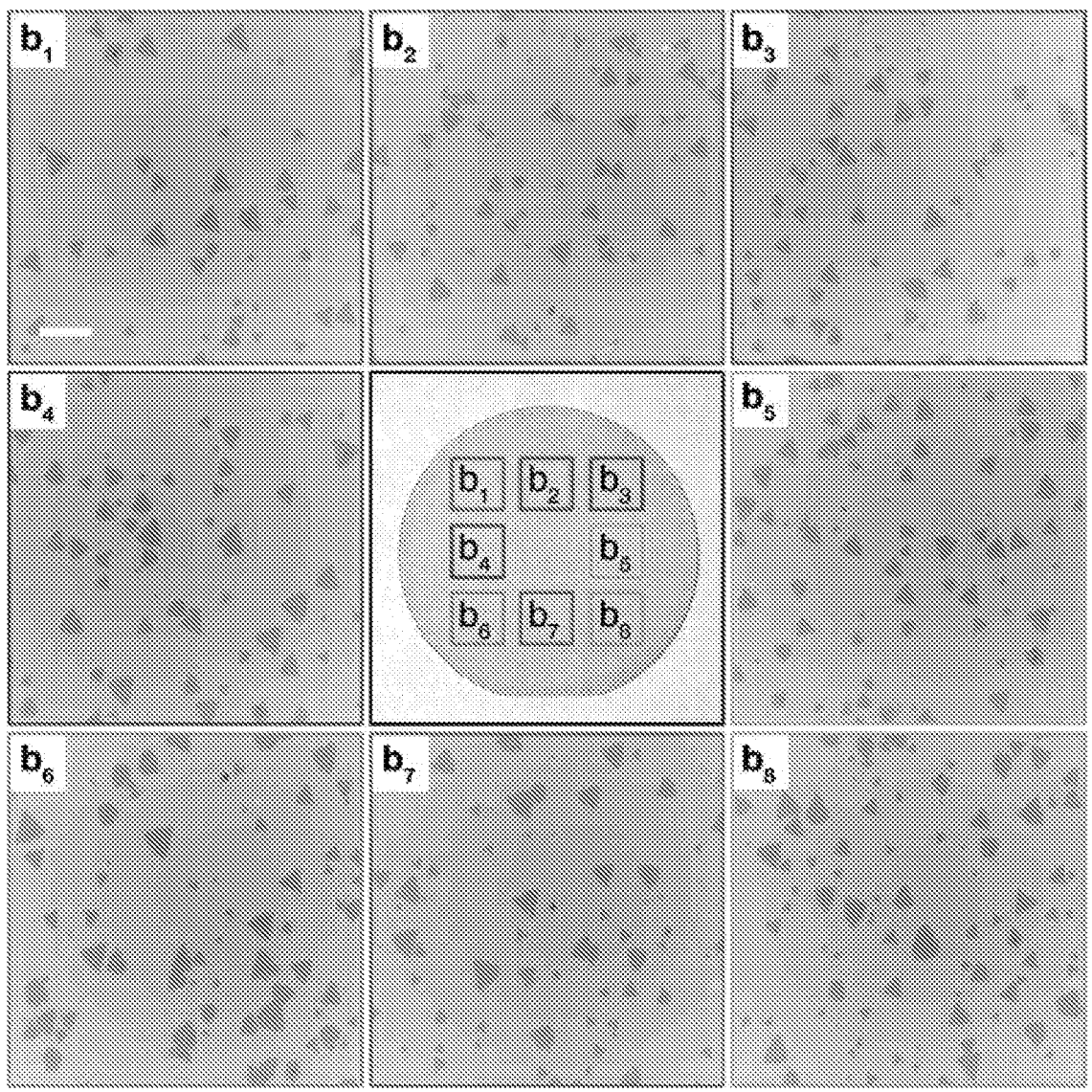
FIG. 2 shows an optical microscopy (OM) image according to the position of $MoS_2$ monolayer flakes on the substrate according to an embodiment of the present invention.
Figure 3:
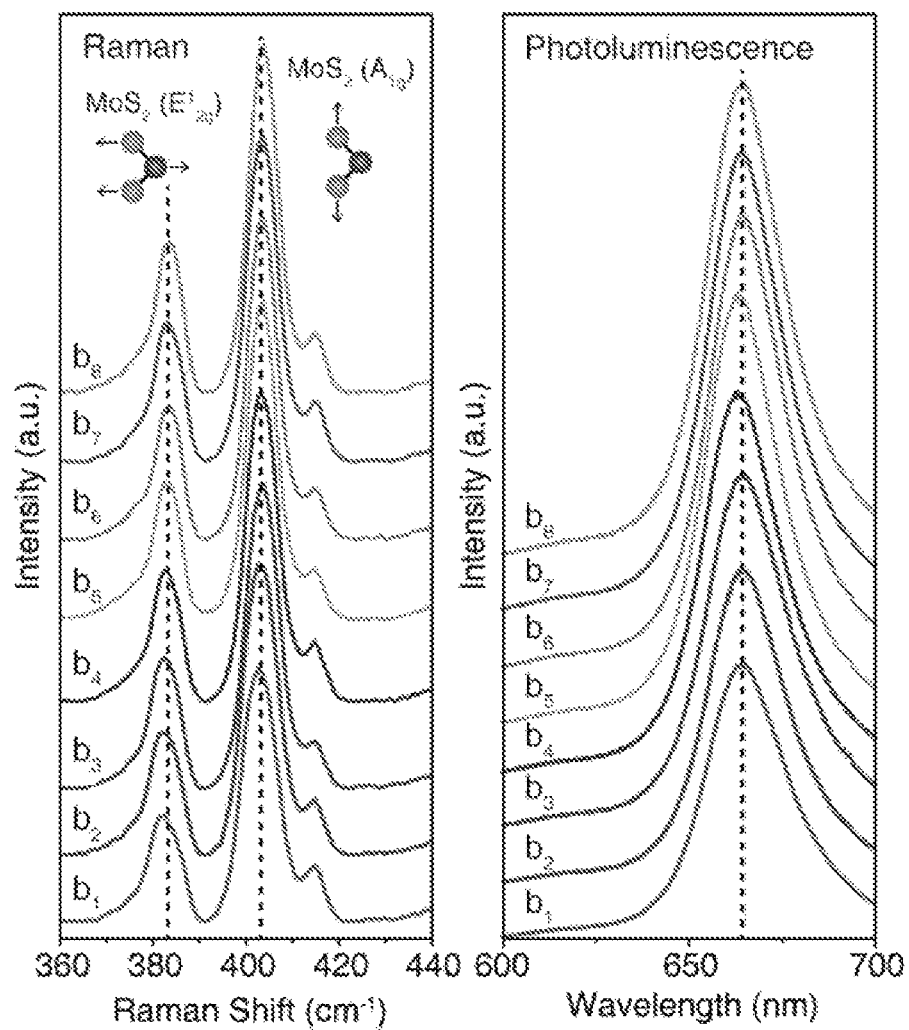
FIG. 3 shows Raman and photoluminescence (PL) spectra of the $MoS_2$ monolayer flakes of FIG. 2.
Figure 4:
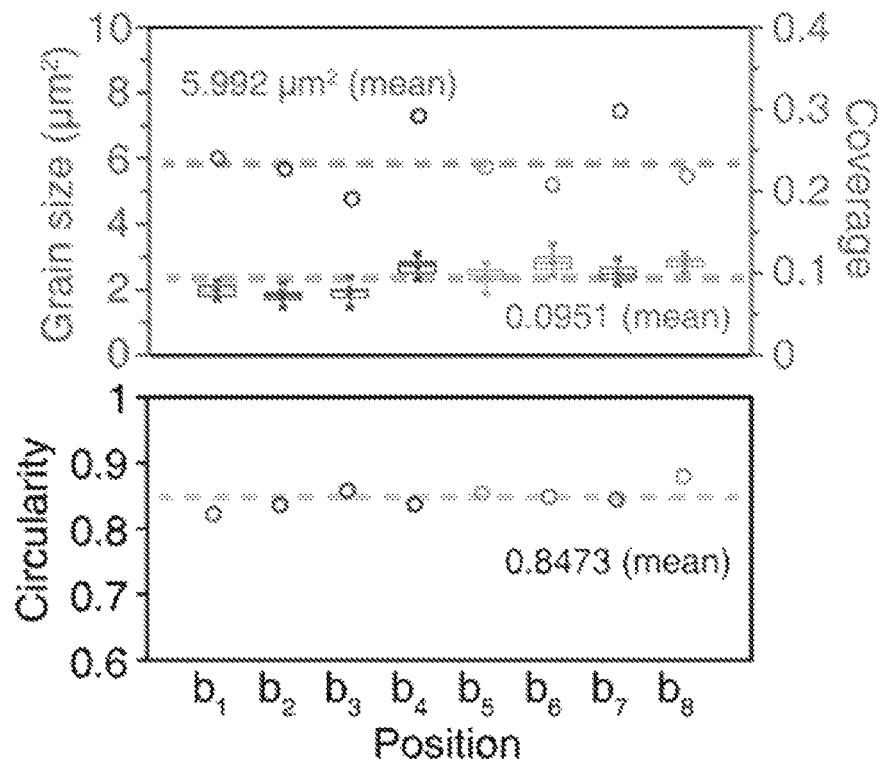
FIG. 4 shows the average grain size, coverage, and circularity of the $MoS_2$ monolayer flakes of FIG. 2.
Figure 5:
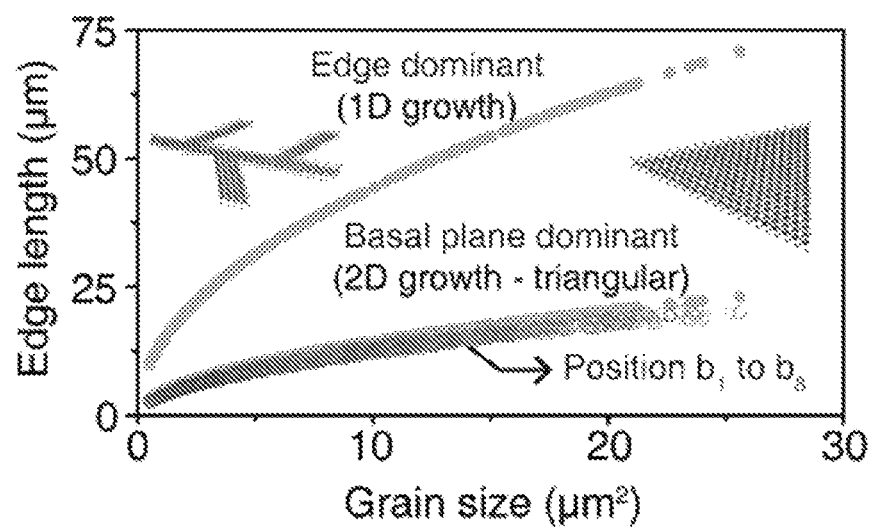
FIG. 5 shows the edge length and grain size of the $MoS_2$ monolayer flakes of FIG. 2.

FIG. 2 shows an optical microscopy (OM) image according to the position of $MoS_2$ monolayer flakes on the substrate according to an embodiment of the present invention, FIG. 3 shows Raman and photoluminescence (PL) spectra of the $MoS_2$ monolayer flakes of FIG. 2, FIG. 4 shows the average grain size, coverage, and circularity of the $MoS_2$ monolayer flakes of FIG. 2, and FIG. 5 shows the edge length and grain size of the $MoS_2$ monolayer flakes of FIG. 2.

Referring to FIG. 2, $MoS_2$ can grow in the first growth mode without a catalyst to form $MoS_2$ monolayer flakes. The $MoS_2$ monolayer flakes can be seen in the OM image obtained in the area indicated by $b_1$ to $b_8$ of the substrate.

Referring to FIG. 3, the difference between the two characteristic peaks of the $MoS_2$ monolayer ($E^1_{2g}$ and $A_{1g}$ vibration) in the Raman spectrum of the layer at various positions on the substrate excited by the 532 nm laser appears uniformly about 19 cm$^{-1}$. Strong and uniform peaks in the photoluminescence spectrum also indicate that the $MoS_2$ monolayer has successfully grown on the entire substrate.

Referring to FIG. 4, the average grain size and coverage of the $MoS_2$ monolayer are uniform and about 5.992 μm² and 0.0951, respectively. The circularity of the $MoS_2$ monolayer is also uniform, and the average circularity of the $MoS_2$ flakes is about 0.8473.

Referring to FIG. 5, the plot between the grain size and the edge length measured for the individual grains in the regions from b1 to b8 consistently follows the trend towards trigonal flakes. These results show growth of triangular monolayers across the entire substrate.

Figure 6:
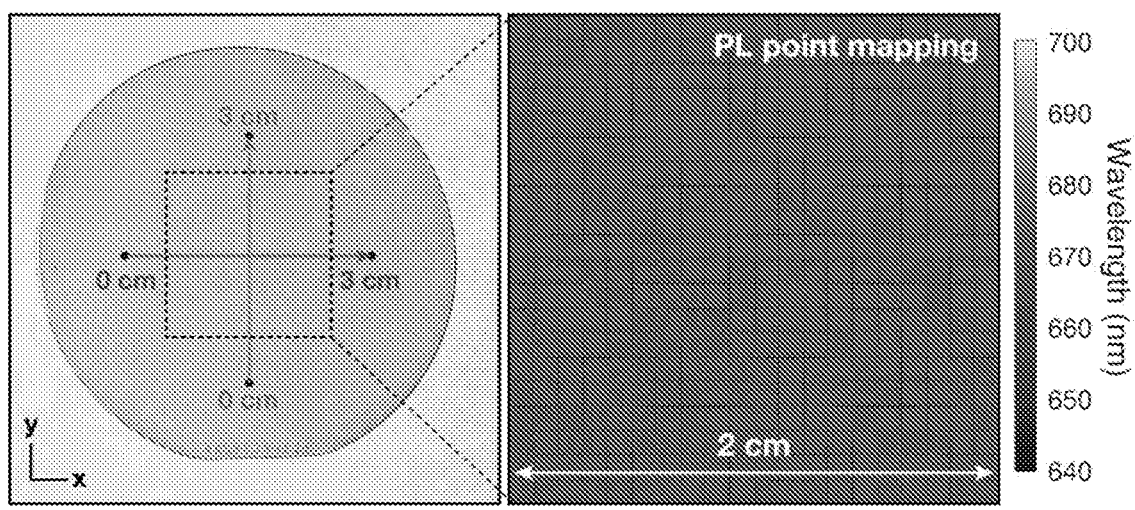
FIG. 6 shows $MoS_2$ continuous film and PL spectral point mapping data according to an embodiment of the present invention.
Figure 7:
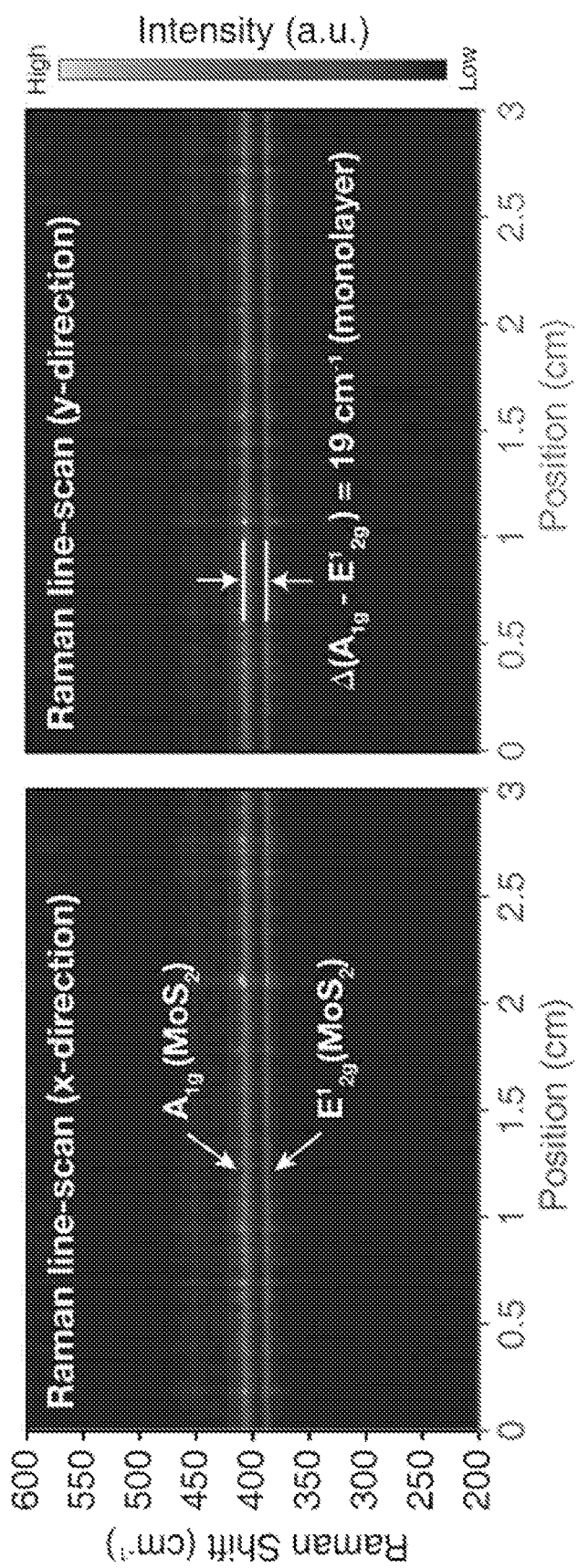
FIG. 7 shows Raman spectrum of the $MoS_2$ continuous film of FIG. 6.

FIG. 6 shows $MoS_2$ continuous film and PL spectral point mapping data according to an embodiment of the present invention and FIG. 7 shows Raman spectrum of the $MoS_2$ continuous film of FIG. 6.

Referring to FIGS. 6 and 7, the uniformity of the photoluminescence spectral point mapping (400 points, point spacing: 1 mm) and Raman line scan data (120 points along the x and y directions, point spacing: 0.25 mm) indicates that the continuous film of the $MoS_2$ monolayer grows uniformly across the entire substrate.

Figure 8:
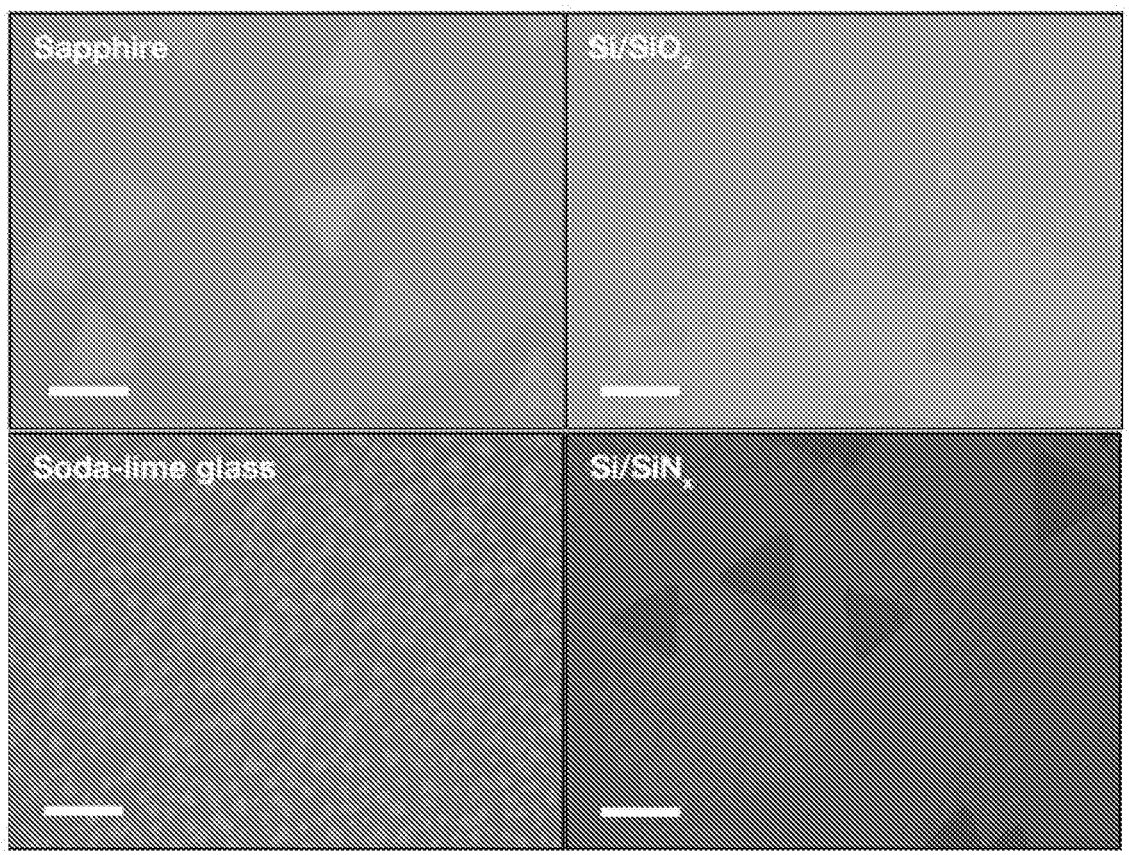
FIG. 8 shows an OM image of the $MoS_2$ monolayer flakes according to the type of the substrate.

FIG. 8 shows an OM image of the $MoS_2$ monolayer flakes according to the type of the substrate.

Referring to FIG. 8, $MoS_2$ growth from $MoO_2$ nanoparticle precursors can be made in various types of substrates comprising sapphire, $Si/SiO_2$, soda lime glass and $Si/SiN_x$ substrates.

Figure 9:
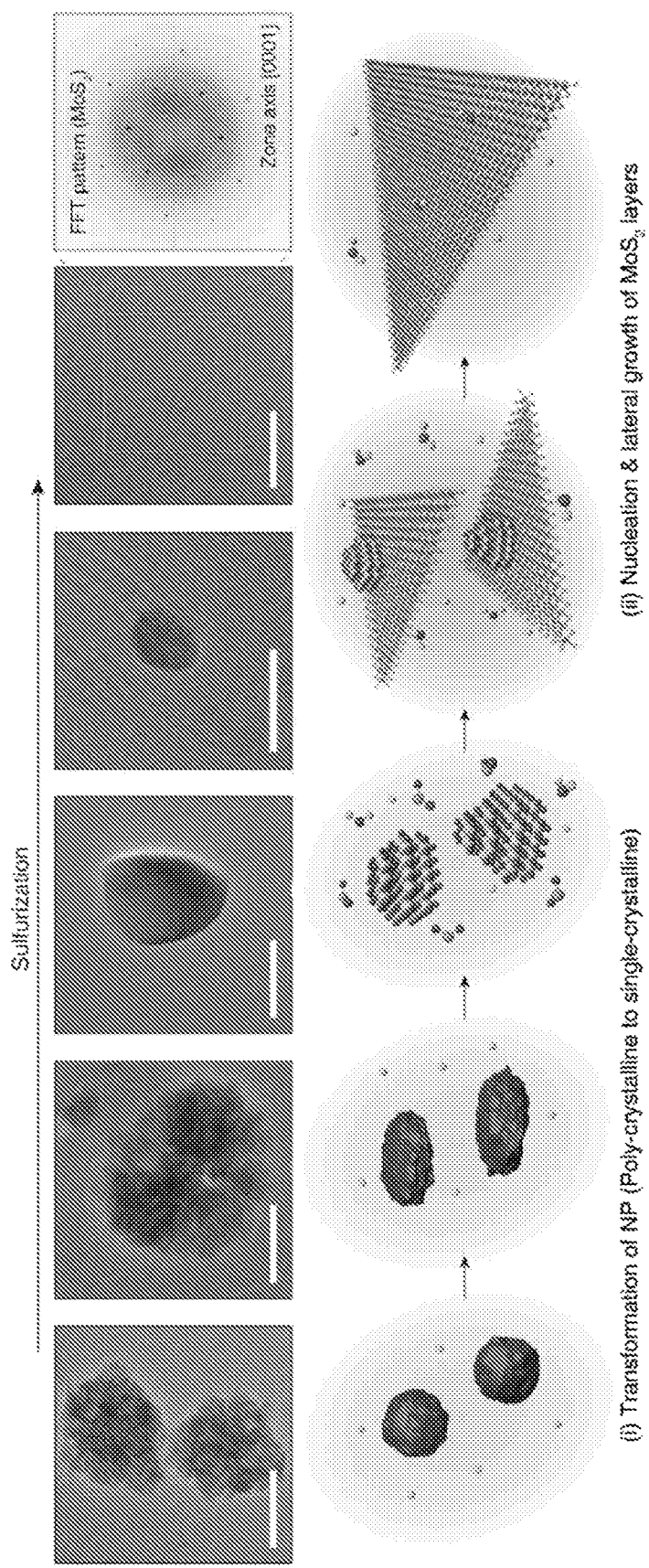
FIG. 9 shows the HRTEM image and growth process of $MoS_2$ growing according to $MoO_2$ nanoparticles and a sulfurization process.

FIG. 9 shows the HRTEM image and growth process of $MoS_2$ growing according to $MoO_2$ nanoparticles and a sulfurization process. High-resolution transmission electron microscopy (HRTEM) can be used to investigate the role of $MoO_2$ nanoparticle precursors for $MoS_2$ growth in the system.

Referring to FIG. 9, in the early stage of sulfurization, polycrystalline $MoO_2$ nanoparticles spread out on the substrate and continuously transform into nanoparticles with single or twinned domains. Then, the $MoS_2$ monolayer is nucleated, and grows at the bottom of the $MoO_2$ nanoparticle that acts as a self-seeding material for $MoS_2$ growth. In the process of sulfurization, $MoO_2$ nanoparticles are continuously consumed by adjacently growing $MoS_2$ monolayers, which is indicated by the diminishing size of the particles. After the precursor particles are exhausted, $MoS_2$ monolayers are formed on the substrate, as confirmed by the high-speed Fourier transform (FFT).

Figure 10:
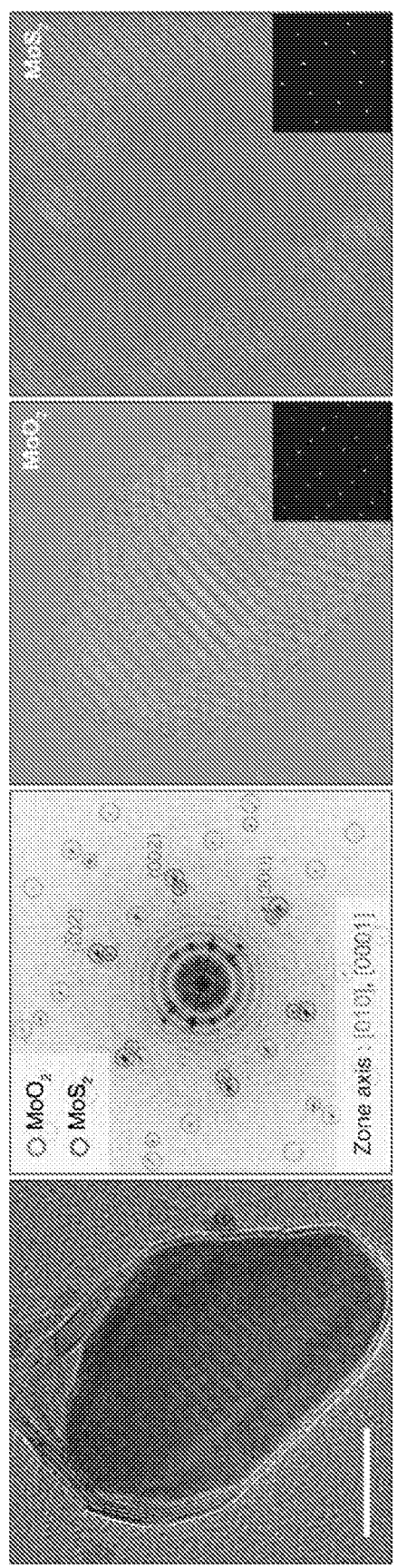
FIGS. 10 and 11 show HRTEM images and FFT patterns in $MoO_2$ crystal and $MoS_2$ domains.
Figure 11:
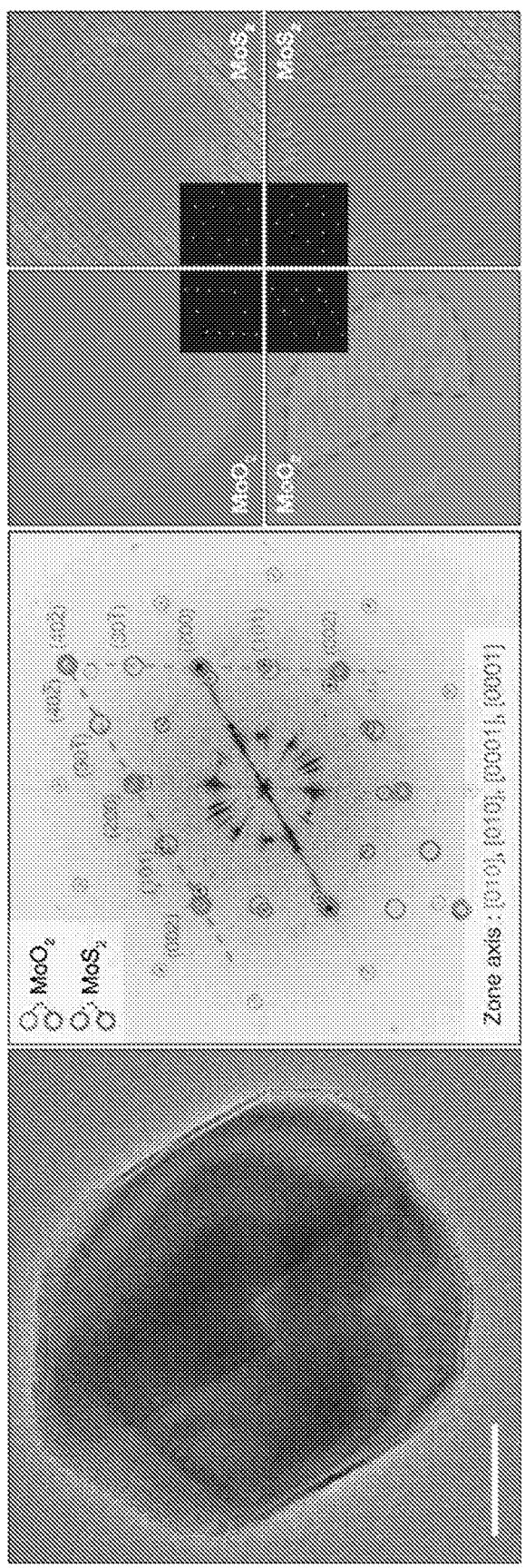

FIGS. 10 and 11 show HRTEM images and FFT patterns in $MoO_2$ crystal and $MoS_2$ domains. By means of an intermediate HRTEM image in which two materials of $MoO_2$ nanoparticles and $MoS_2$ monolayer coexist, it is possible to see how $MoO_2$ nanoparticles affect the growth process of the $MoS_2$ monolayer. The HRTEM image of FIG. 10 shows single crystalline $MoO_2$ nanoparticles under the $MoS_2$ monolayer.

Referring to FIGS. 10 and 11, indexing the FFT pattern based on the measured lattice spacing and the relative angle reveals a monoclinic phase of $MoO_2$ nanocrystals with the [10] area axis (Z.A.) on the substrate. The $\{10\bar{1}0\}$ plane of the $MoS_2$ monolayer is strongly correlated with the (002), (200) and ($\bar{2}$02) planes (green-blue paired circles) of the monoclinic $MoO_2$.

The spatial arrangement of the $MoO_2$ nanoparticles and the growing $MoS_2$ monolayers is visualized by an inverse FFT image obtained from independently masked FFT patterns for the two materials. The growth of the $MoS_2$ monolayers from the $MoO_2$ nanoparticles composed of the twinned domains confirms that the growth behavior of $MoS_2$ is determined by the $MoO_2$ nanoparticles. Two domains of the $MoO_2$ nanocrystal are independently correlated with two $MoS_2$ domains grown adjacently. Both domains of the twinned $MoO_2$ nanocrystal expose specific planes along the Z.A. [10]. The (002), (200), and (202) planes of one $MoO_2$ domain with the Z.A. [10] are associated with the orientation of the $MoS_2$ monolayer in a consistent way (green-blue paired circles).

Figure 12:
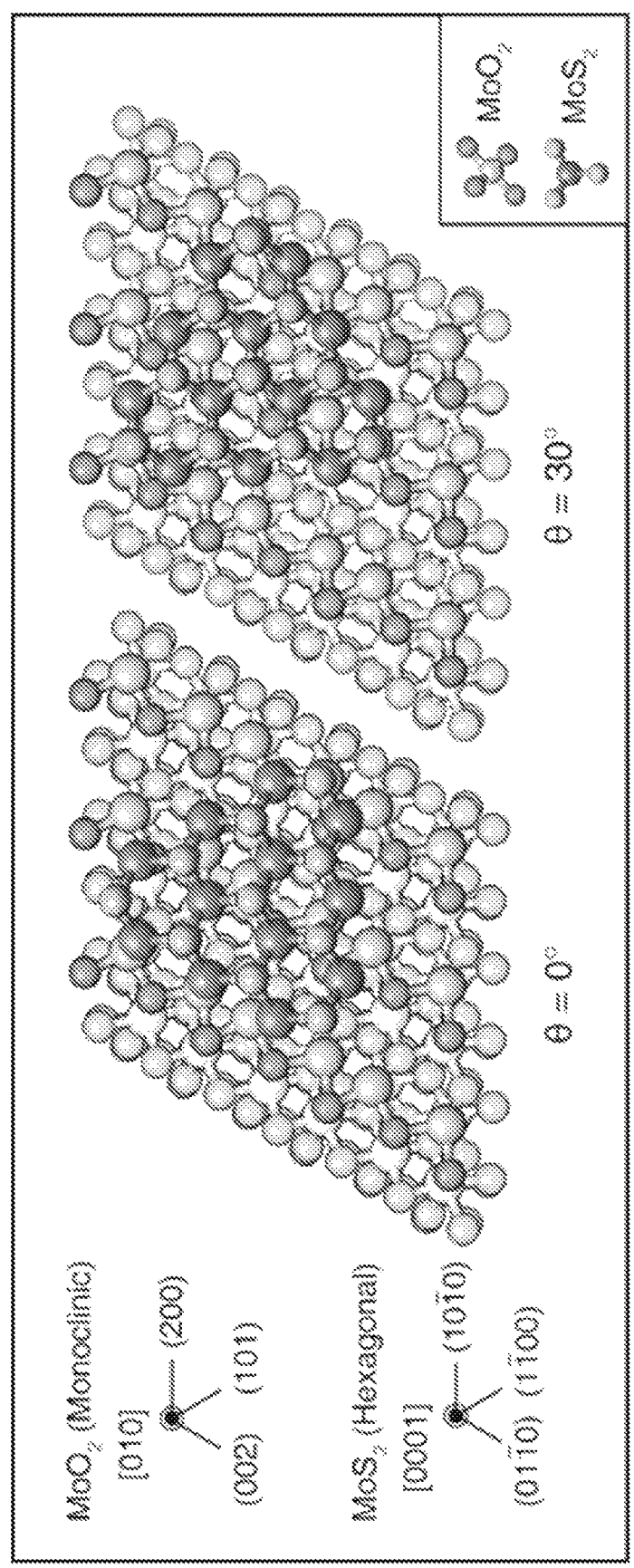
FIG. 12 shows an atomic model for the $MoO_2$ and $MoS_2$ crystals aligned with rotation angles of 0° and 30°.
Figure 13:
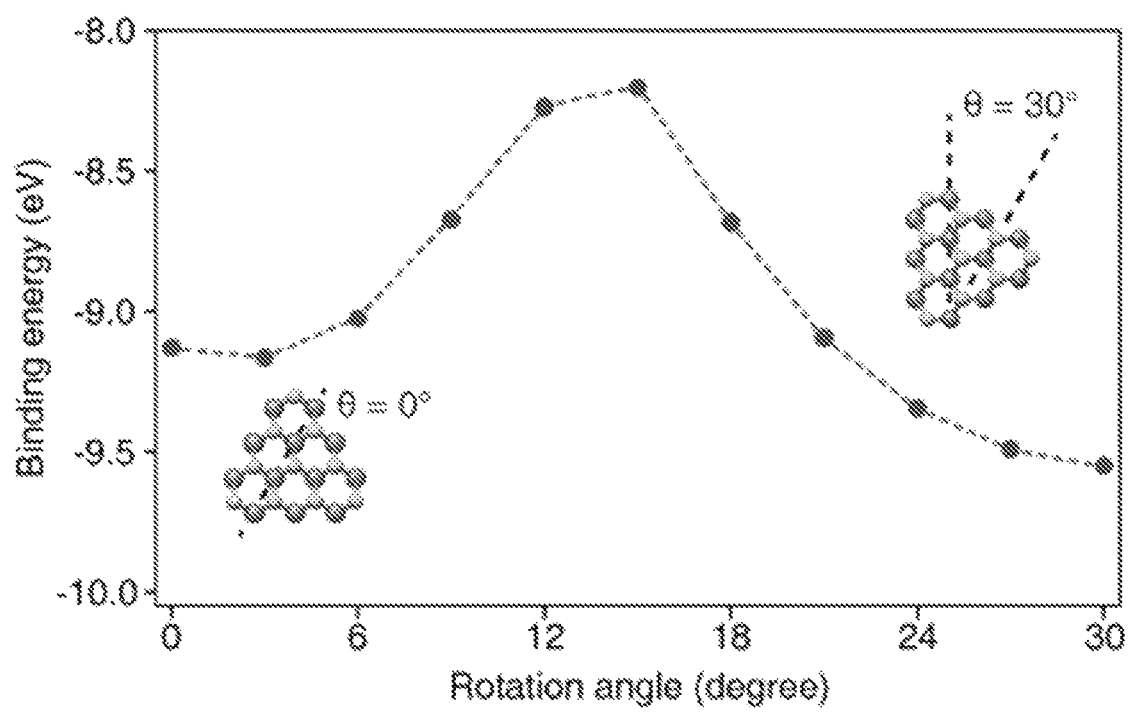
FIG. 13 shows the bonding energy between $MoS_2$ and $MoO_2$ according to the rotation angle.

FIG. 12 shows an atomic model for the $MoO_2$ and $MoS_2$ crystals aligned with rotation angles of 0° and 30°, and FIG. 13 shows the bonding energy between $MoS_2$ and $MoO_2$ according to the rotation angle.

Referring to FIGS. 12 and 13, the growth direction of the $MoS_2$ monolayer from another domain of $MoO_2$ with a Z.A. [10] is tilted by 30° (orange-magenta paired circles). Selected inverse FFT patterns of the two domains of $MoO_2$ and the independently grown $MoS_2$ monolayers represent their spatial arrangements. Furthermore, density functional theory (DFT) calculation reveals energetically preferred orientations in the growth of $MoS_2$ $\{10\bar{1}0\}$ on $MoO_2$ (200). Local minima of the binding energy are observed at around 0 and 30° rotation angles, which is consistent with the experimental data.

Figure 14:
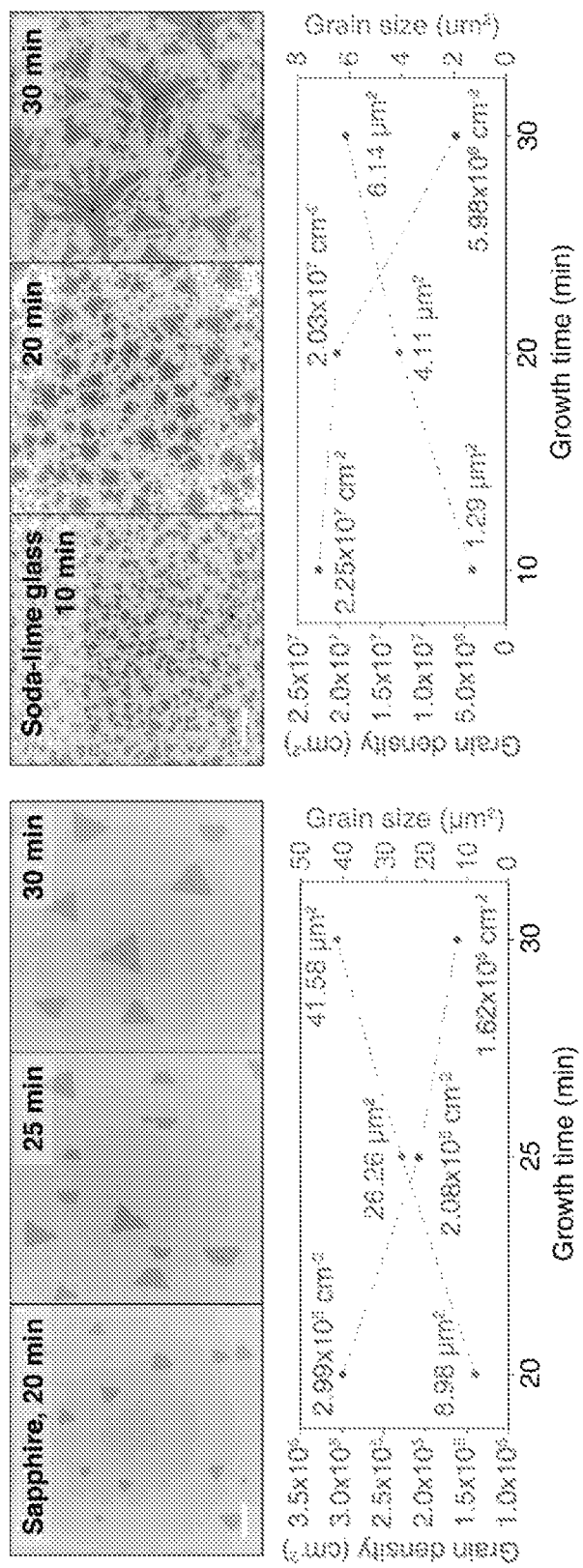
FIG. 14 shows an OM image of the $MoS_2$ monolayer according to the growth time.
Figure 15:
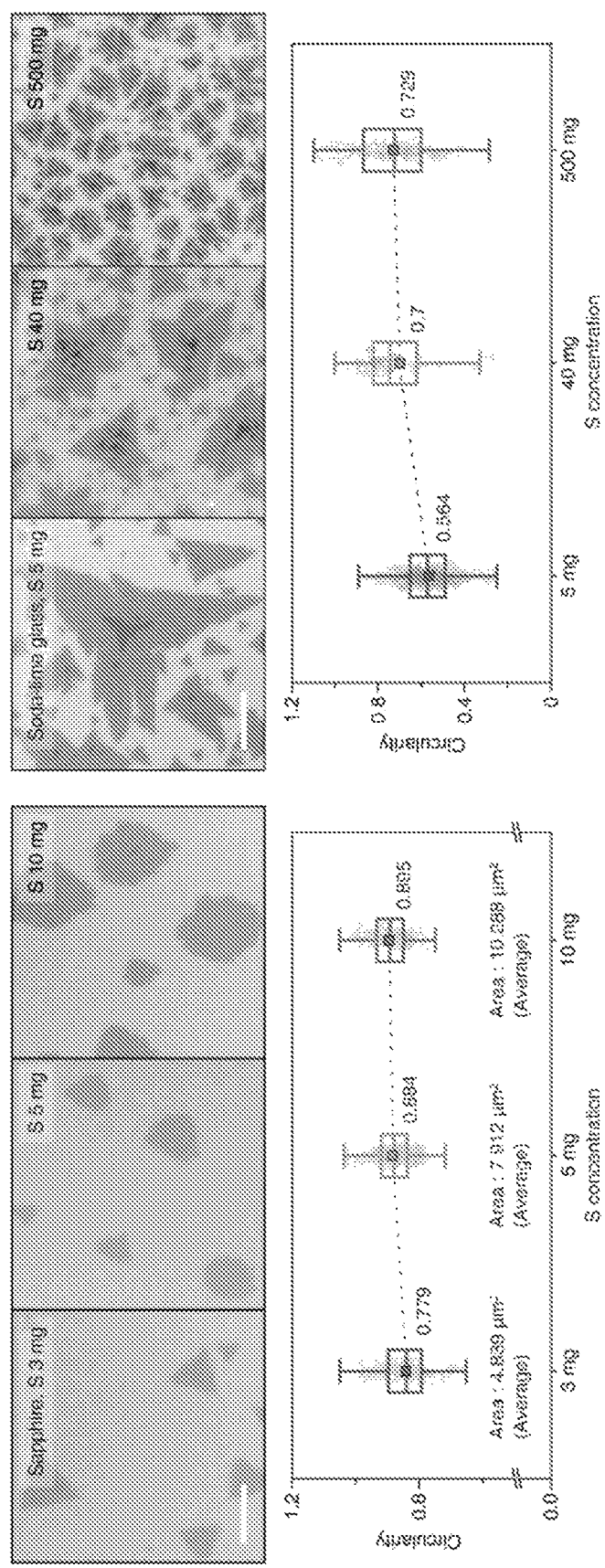
FIG. 15 shows an OM image of the $MoS_2$ monolayer according to the concentration of sulfur.
Figure 16:
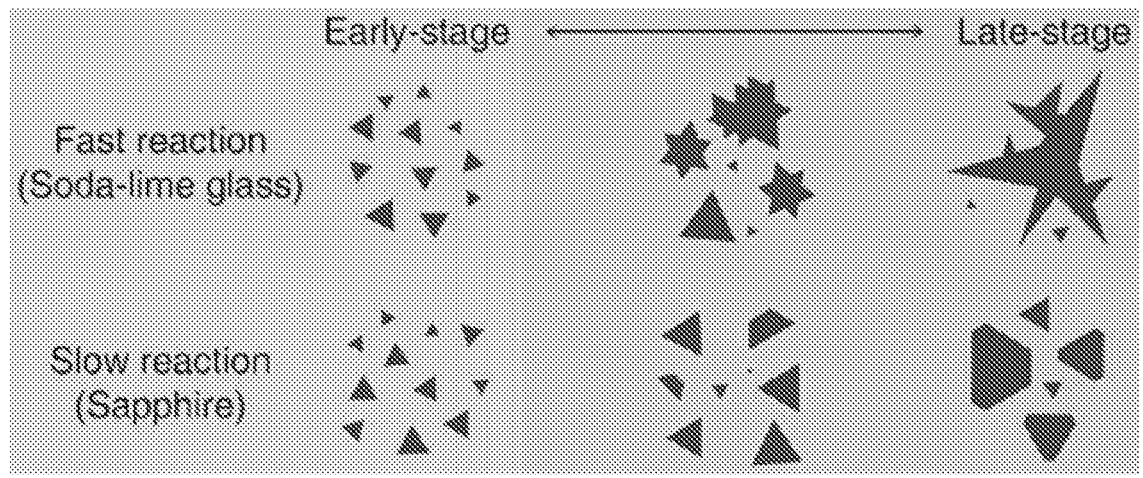
FIGS. 16 and 17 show the size and shape change of the $MoS_2$ monolayer according to the reaction rate and growth parameters.
Figure 17:
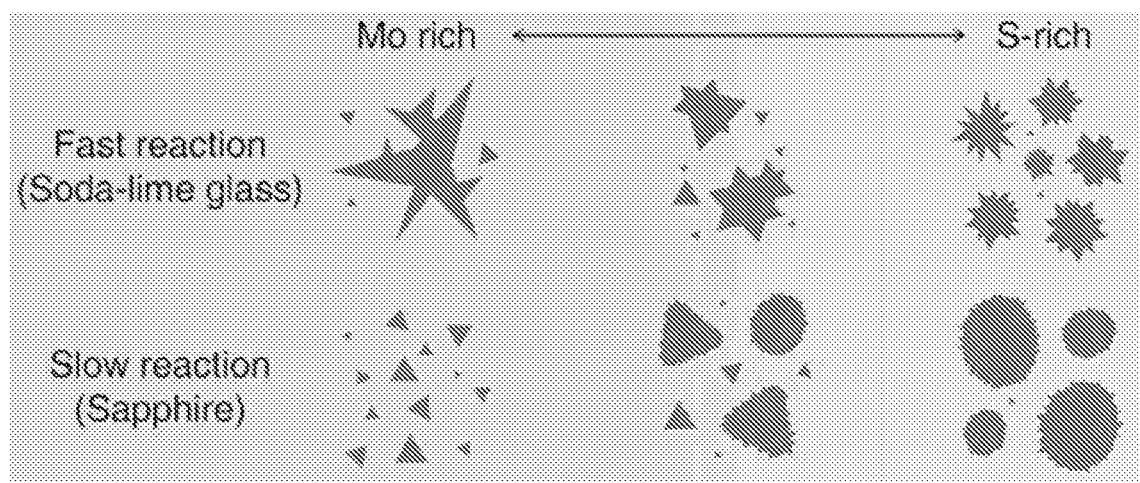

FIG. 14 shows an OM image of the $MoS_2$ monolayer according to the growth time, FIG. 15 shows an OM image of the $MoS_2$ monolayer according to the concentration of sulfur, and FIGS. 16 and 17 show the size and shape change of the $MoS_2$ monolayer according to the reaction rate and growth parameters.

Referring to FIGS. 14 and 16, with a prolonged growth time, $MoS_2$ on sapphire increases the averaged grain size, while maintaining triangular morphologies with marginal truncation of corners, and the proportion of small grains is gradually reduced. The growth of $MoS_2$ on the soda-lime glass substrate is initiated by densely packed nucleation sites, possibly by catalytic characteristic of the substrate. The growth results in multiple branched morphology with the increased domain size, as it is highly kinetically controlled. In both substrates, ripening of pre-formed domains occurs in the late stage of sulfurization, since the monomer concentration is locally limited, which allows the consumption of unstable small grains by adjacently growing monolayers.

Referring to FIGS. 15 and 17, the ratio of molybdenum to sulfur precursor manipulates the edge structure of the $MoS_2$ monolayer, resulting in different morphologies. Sharp triangular layers become round-shaped layers with rough edge interfaces in high sulfur concentrations. The effect of the ratio of the two precursors is more obvious in the $MoS_2$ growth on soda-lime glass. The molybdenum dominant environment induced by the reduced sulfur supply promotes the growth of layers with sharp edges, confirmed by the low circularity (0.564). In contrast, with an excess sulfur concentration, $MoS_2$ monolayers show highly dendritic morphologies with a relatively homogeneous size distribution, presumably by suppression of the ripening process.

As such, the size and morphology of the $MoS_2$ monolayer can be easily adjusted by manipulating growth parameters such as growth time, precursor concentration, and substrate type. In addition, the function of the transition metal dichalcogenide monolayer in various applications can be improved by controlling the size and morphology.

Figure 18:
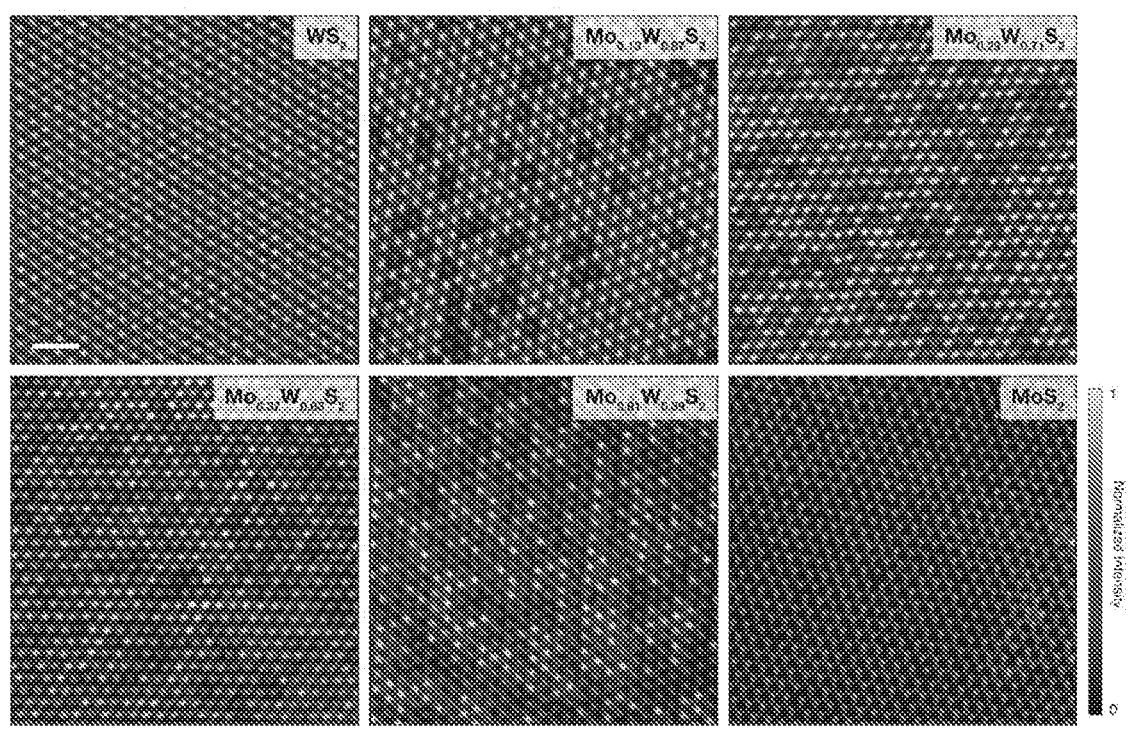
FIG. 18 shows a HAADF-STEM image of a $Mo_{1-x}W_xS_2$ monolayer according to an embodiment of the present invention.
Figure 19:
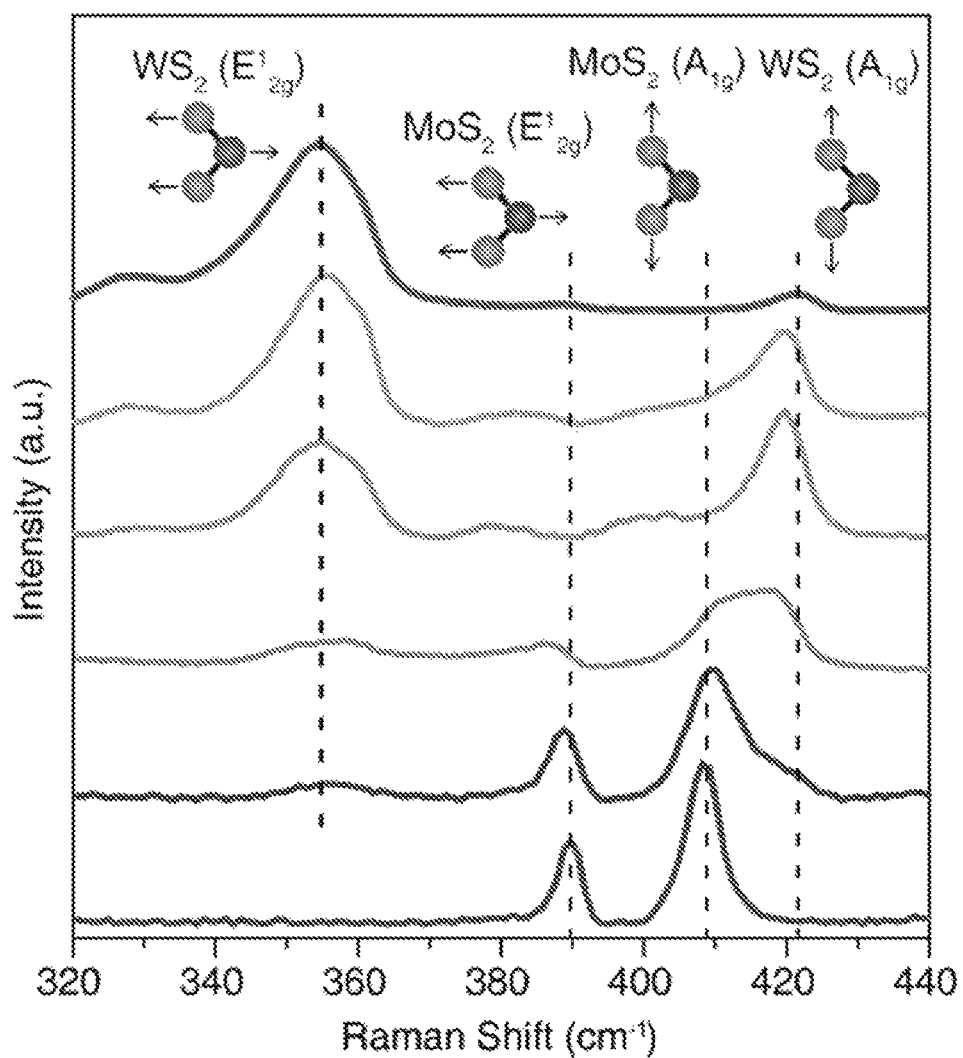
FIG. 19 shows Raman spectra of the $Mo_{1-x}W_xS_2$ monolayer.
Figure 20:
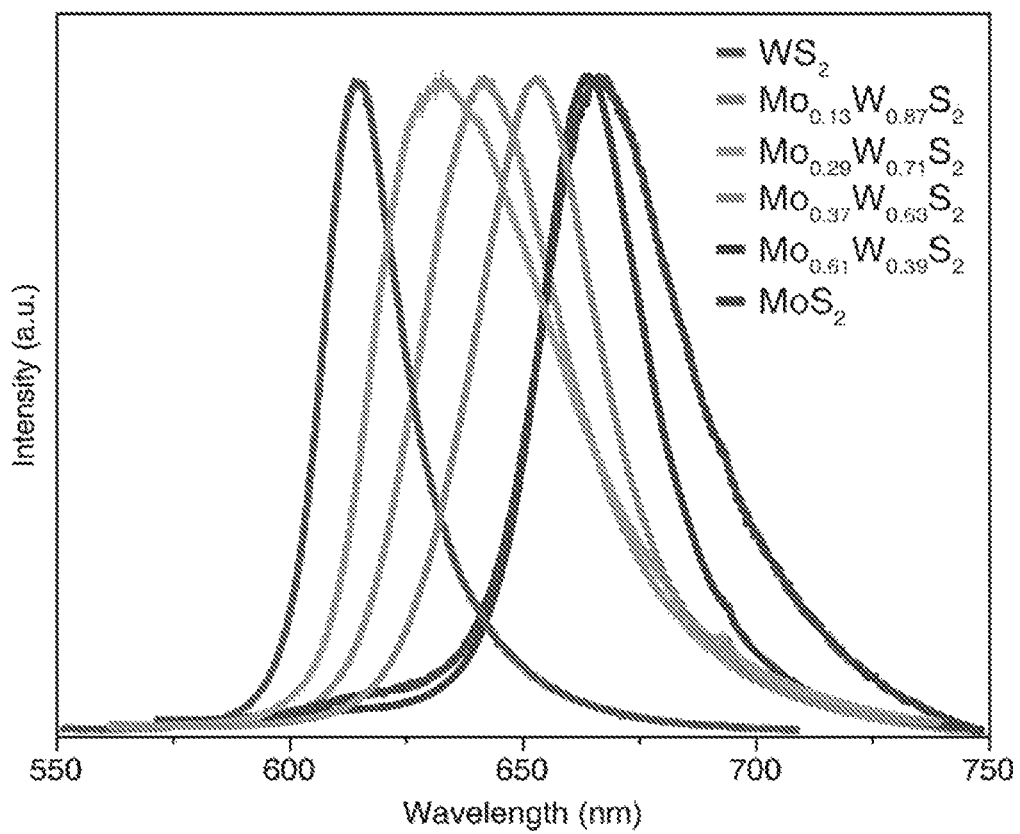
FIG. 20 shows PL spectra of the $Mo_{1-x}W_xS_2$ monolayer.
Figure 21:
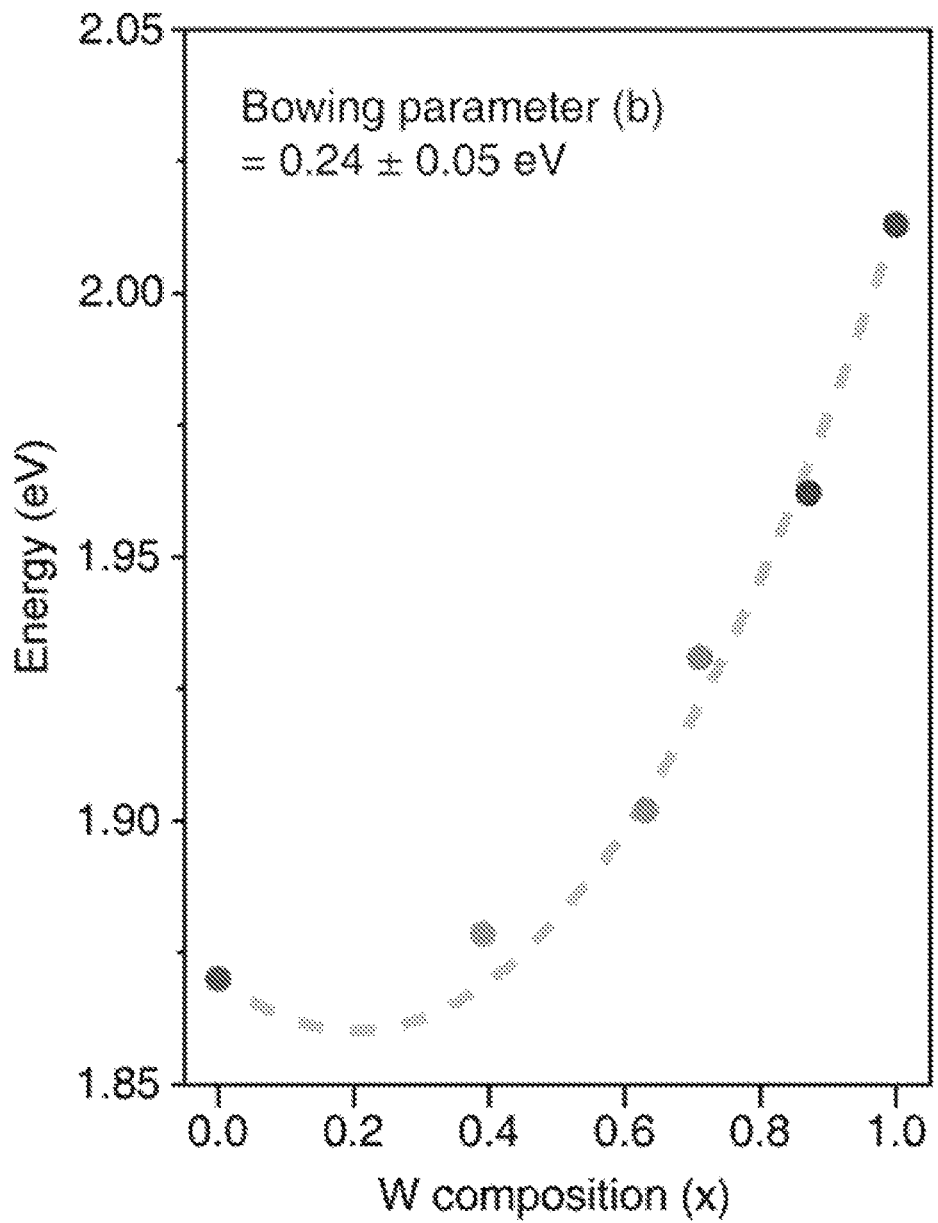
FIG. 21 shows the optical bandgap energy of the $Mo_{1-x}W_xS_2$ monolayer.

FIG. 18 shows a HAADF-STEM image of a $Mo_{1-x}W_xS_2$ monolayer according to an embodiment of the present invention, FIG. 19 shows Raman spectra of the $Mo_{1-x}W_xS_2$ monolayer, FIG. 20 shows PL spectra of the $Mo_{1-x}W_xS_2$ monolayer, and FIG. 21 shows the optical bandgap energy of the $Mo_{1-x}W_xS_2$ monolayer.

Referring to FIG. 18, $Mo_{1-x}W_xS_2$ (0<x<1) can be synthesized by using the dual-precursor solution of molybdenum oxide ($MoO_2$) nanoparticles and tungsten oxide ($W_{18}O_{49}$) nanoparticles that are easily mixed and uniformly deposited on a substrate. Simple mixing of the two nanoparticle precursor solutions with different concentrations allows the synthesis of $Mo_{1-x}W_xS_2$ alloy monolayers with various compositions. The arrangement of Mo and W atoms in $Mo_{1-x}W_xS_2$ monolayers with the compositional variation can be visualized by high-angle annular dark-field scanning transmission electron microscopy (HAADF-STEM), where the intensity is dependent on the atomic number. The compositional ratio between W and Mo is estimated by counting the number of bright W and dark Mo atoms from multiple atomic-resolution HAADF-STEM images.

Referring to FIGS. 19 and 20, Raman spectra of $WS_2$ and $MoS_2$ monolayers show the characteristic peaks of $E^1_{2g}$ and $A_{1g}$ modes for both materials. $Mo_{1-x}W_xS_2$ alloy monolayers show the characteristic Raman peaks of both $MoS_2$ and $WS_2$ with relative intensities and peak positions, which correspond to the compositional ratio of Mo and W elements. PL measurements confirm that the optical bandgap energy is successfully tuned by synthesizing of $Mo_{1-x}W_xS_2$ alloy monolayers with the controlled composition ratio.

Referring to FIG. 21, the optical bandgap energies of $Mo_{1-x}W_xS_2$ alloy monolayers match well with the bowing effect, following the given Equation 1.

$$E_{PL,Mo_{1-x}W_xS_2} = (1-x)E_{PL,MoS_2} + xE_{PL,WS_2} - bx(1-x) \quad \text{[Equation 1]}$$

where x is the composition for tungsten (W) element, $E_{PL,MoS_2}$, $E_{PL,WS_2}$, and $E_{PL,Mo_{1-x}W_xS_2}$ are the measured optical bandgap energies of $MoS_2$, $WS_2$, and $Mo_{1-x}W_xS_2$ monolayers, respectively, and b is the calculated bowing parameter of (0.24±0.05) eV. These results prove that the optical bandgap energy of the $Mo_{1-x}W_xS_2$ alloy monolayer is successfully tuned by the compositional change using dual-precursors.

Figure 22:
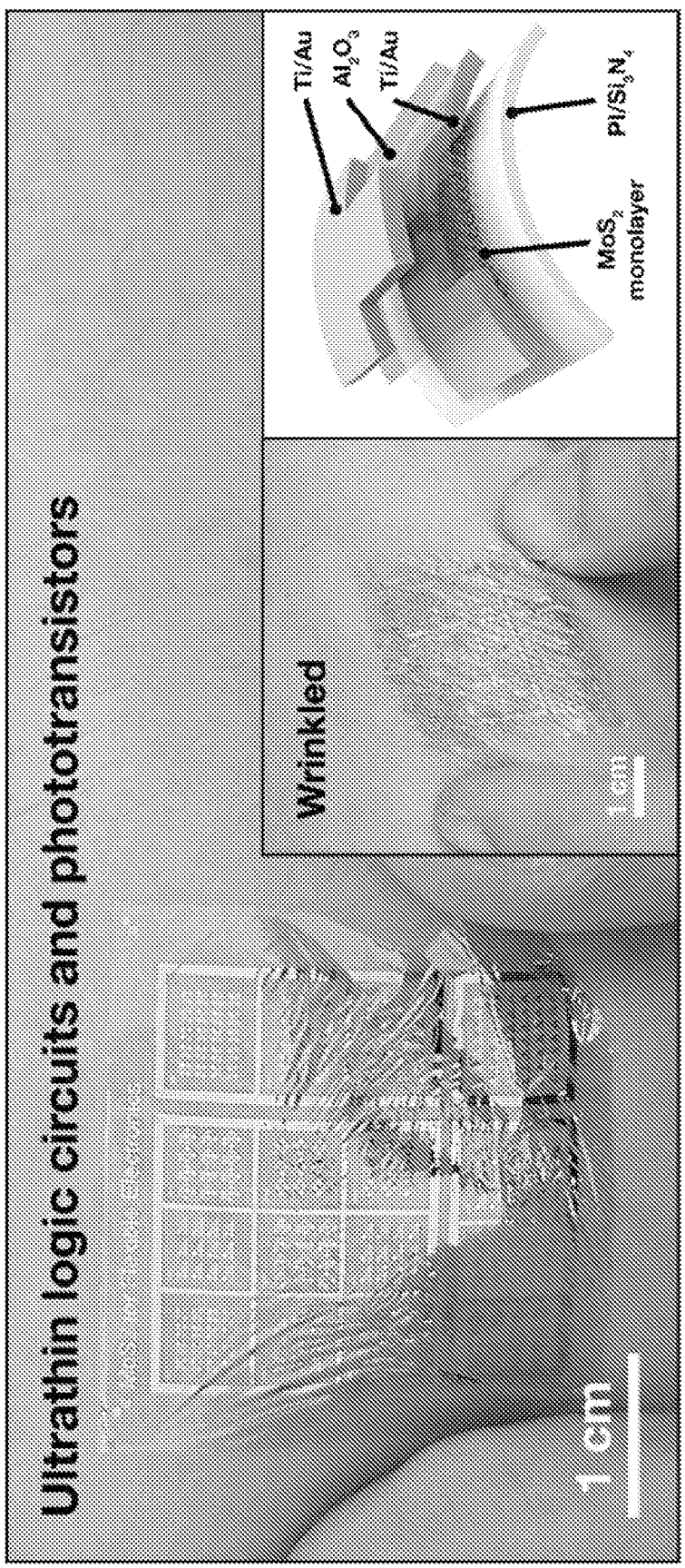
FIG. 22 shows an image of an ultra-thin film logic circuit and a phototransistor.

FIG. 22 shows an image of an ultra-thin film logic circuit and a phototransistor.

Referring to FIG. 22, a $MoS_2$ field effect transistor (FET) was formed to investigate the uniformity of the $MoS_2$ film. A brief description of the formation process is as follows. The $MoS_2$ film is transferred onto the $Si_3N_4$ layer and patterned by photolithography and dry etching. Using a thermal evaporation process, the Ti/Au layer (5 nm/25 nm) is deposited and patterned by a lift-off process to form a source/drain electrodes. Using atomic layer deposition process, the $Al_2O_3$ layer (20 nm) is deposited and patterned. The Ti/Au layer (5 nm/25 nm thickness) is deposited using a thermal evaporation process and patterned by a lift-off method to form a gate electrode. The phototransistor can withstand external mechanical deformation due to the inherent softness of the $MoS_2$ film and the ultra-thin device thickness (approximately 1 μm), which can be applied to skin-mounted electronics.

Figure 23:
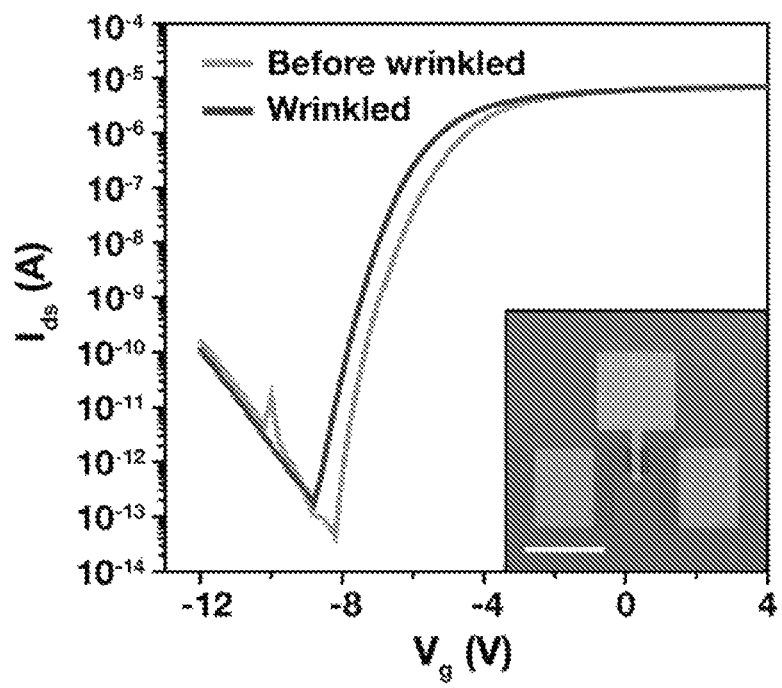
FIGS. 23 and 24 show transfer curves of an ultra-thin film $MoS_2$ FET.
Figure 24:
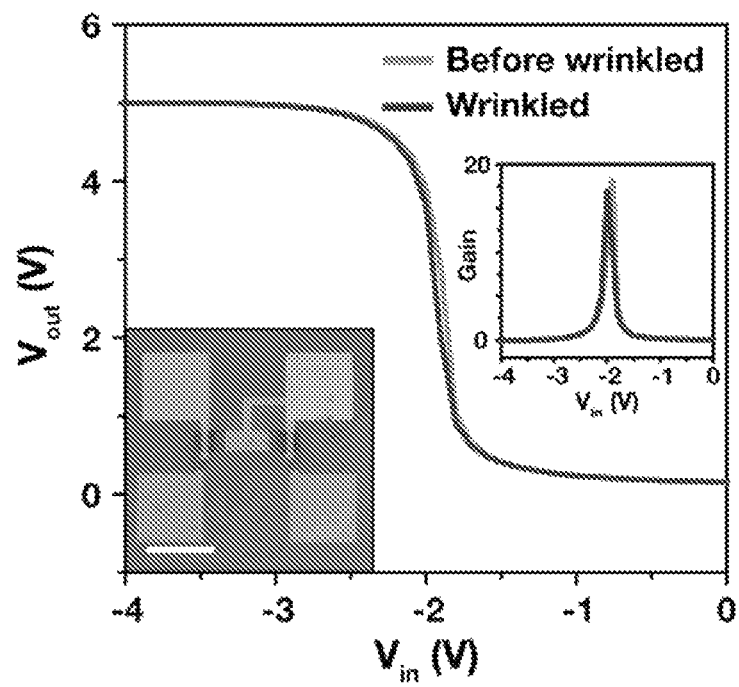

FIGS. 23 and 24 show transfer curves of an ultra-thin film $MoS_2$ FET.

Referring to FIGS. 23, the transfer characteristics of $MoS_2$ FET show minimal change under mechanical strain. Also, referring to FIG. 24, the inverter shows a voltage gain of 18.5 at $V_{dd}$=5V and shows stable operation even in a wrinkled state.

FIGS. 25 to 28 show output characteristics of gate electrodes. FIGS. 25 to 28 show NAND gates, NOR gates, AND gates, and SRAM gates, respectively. The NAND gate and the NOR gate consist of a transistor and an inverter, the AND gate consists of a NAND gate and an inverter, and the SRAM consists of two cross-linked inverters.

Figure 25:
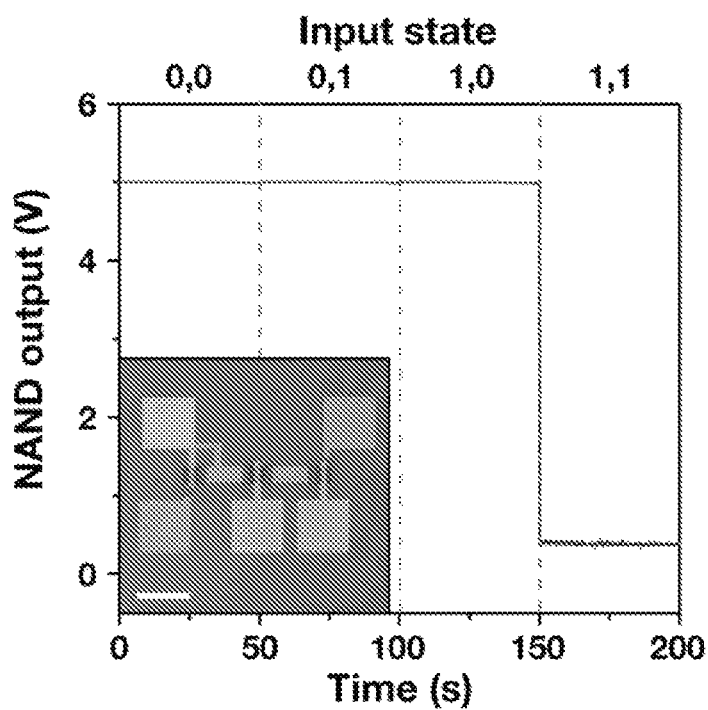
FIGS. 25, 26, 27, and 28 show output characteristics of gate electrodes.
Figure 26:
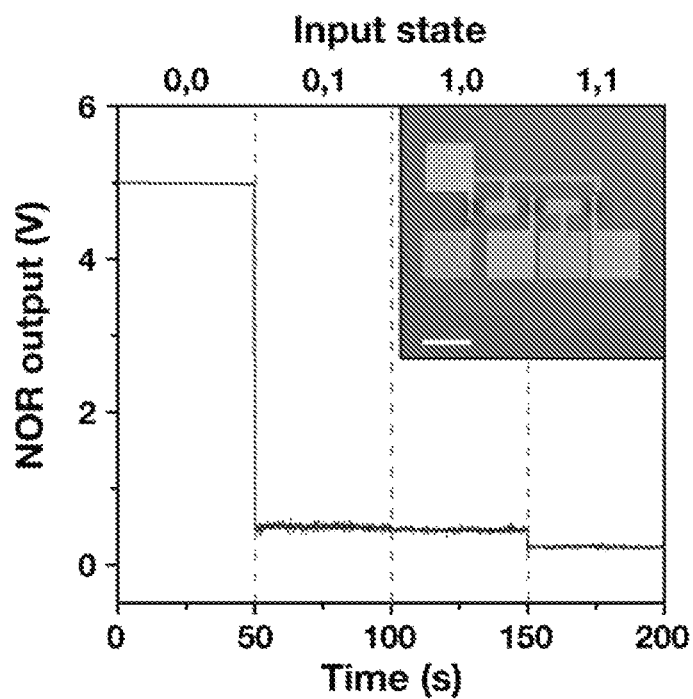
Figure 27:
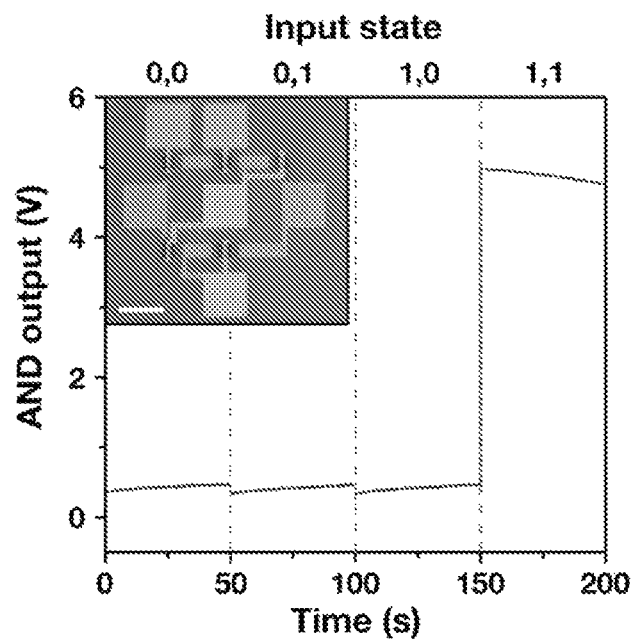

Referring to FIGS. 25 to 27, the NAND gate, the NOR gate, and the AND gate indicates the output state of '0' (0V) or '1' (5V) according to the four states (e.g., (0,0), (0,1), (1,0) and (1,1)) of the two inputs having $V_{dd}$=5V.

Figure 28:
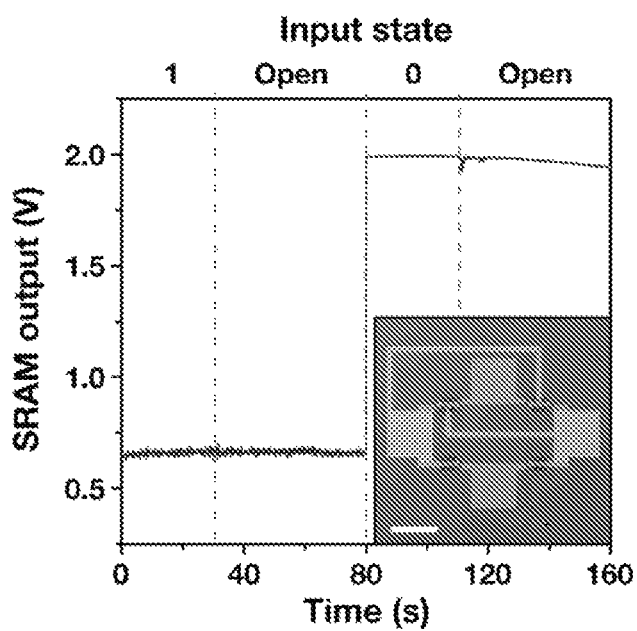

Referring to FIG. 28, if the input is set to '1' in 0 second or '0' in 80 seconds, the logical state becomes '0' or '1' respectively. The logical state for 50 seconds can be maintained after the input is opened in 30 seconds or 110 seconds and has stable memory performance.

As such, the reliable operation of the logic gate indicates that the $MoS_2$ film can be applied to a large integrated circuit. In addition, $MoS_2$ film can also be applied to flexible optoelectronic devices such as photodetectors due to high light absorption coefficients.

As described above, transition metal oxide nanoparticles can be used as precursors to form a 2D transition metal dichalcogenide monolayer having an atomic-level thickness. The precursors can be easily deposited with uniform coverage on the substrate, facilitating the mass production of the transition metal dichalcogenide monolayer. Various growth parameters can be adjusted to produce a variety of 2D materials. In addition, the composition of the $Mo_{1-x}W_xS_2$ alloy monolayer can be adjusted by manipulating the mixing ratio of the dual-precursors such as $MoO_2$ and $W_{18}O_{49}$ nanoparticles, thereby various 2D materials with different optical bandgaps can be produced.

As above, the exemplary embodiments of the present invention have been described. Those skilled in the art will appreciate that the present invention may be embodied in other specific ways without changing the technical spirit or essential features thereof. Therefore, the embodiments disclosed herein are not restrictive but are illustrative. The scope of the present invention is given by the claims, rather than the specification, and also contains all modifications within the meaning and range equivalent to the claims.

What is claimed is:

1. A method of forming a compound structure comprising:
   loading a metal precursor on a substrate;
   providing a chalcogen precursor to the substrate; and
   reacting the chalcogen precursor with the metal precursor,
   wherein the metal precursor comprises transition metal nanoparticles,
   wherein the compound structure has a 2-dimensional structure,
   wherein the providing the chalcogen precursor to the substrate comprises disposing the substrate and the chalcogen precursor in a furnace and providing carrier gas to the furnace, and
   wherein the chalcogen precursor is supplied to the substrate by the carrier gas,
   wherein the furnace comprises a first furnace and a second furnace that are heated independently of each other, and
   wherein the chalcogen precursor is disposed in the first furnace, the substrate is disposed in the second furnace, and the carrier gas flows from the first furnace to the second furnace.

2. The method of claim 1, wherein the chalcogen precursor comprises at least one of sulfur, selenium, and tellurium.

3. The method of claim 2, wherein the transition metal nanoparticles comprise at least one of $MoO_2$ nanoparticles and $W_{18}O_{49}$ nanoparticles.

4. The method of claim 1, wherein the loading the metal precursor on the substrate comprises forming a precursor solution comprising the transition metal nanoparticles and spin-coating the precursor solution on the substrate.

5. The method of claim 4, wherein the forming the precursor solution comprises adding a catalyst material to the precursor solution and the catalyst material comprises at least one of sodium chloride and potassium hydroxide.

6. The method of claim 1, wherein the compound structure is formed by performing a CVD process.

7. The method of claim 1, wherein the heating temperature of the second furnace is higher than the heating temperature of the first furnace.

8. The method of claim 1, wherein the substrate is tilted with respect to the flow direction of the carrier gas.

9. A method of forming a compound structure comprising:
loading a metal precursor on a substrate;
providing a chalcogen precursor to the substrate; and
reacting the chalcogen precursor with the metal precursor,
wherein the providing the chalcogen precursor to the substrate comprises disposing the substrate and the chalcogen precursor in a furnace and providing carrier gas to the furnace,
wherein the chalcogen precursor is supplied to the substrate by the carrier gas,
wherein the furnace comprises a first furnace and a second furnace that are heated independently of each other, and
wherein the chalcogen precursor is disposed in the first furnace, the substrate is disposed in the second furnace, and the carrier gas flows from the first furnace to the second furnace.

* * * * *